United States Patent [19]
Gantioler et al.

[11] Patent Number: 5,731,721
[45] Date of Patent: Mar. 24, 1998

[54] INTEGRATABLE COMPARATOR CIRCUIT WITH ADJUSTABLE RESPONSE THRESHOLD

[75] Inventors: Josef-Matthias Gantioler; Holger Heil, both of München, Germany

[73] Assignee: Siemens Aktiengesellschaft, Munich, Germany

[21] Appl. No.: 699,233

[22] Filed: Aug. 19, 1996

[30] Foreign Application Priority Data

Aug. 18, 1995 [DE] Germany .................. 195 30 481.0

[51] Int. Cl.$^6$ .................................................. H03K 5/153
[52] U.S. Cl. .................................................. 327/81; 327/80
[58] Field of Search ............................ 327/77, 78, 79, 327/80, 81, 50

[56] References Cited

U.S. PATENT DOCUMENTS

| | | | |
|---|---|---|---|
| 4,463,270 | 7/1984 | Gordon | 327/77 |
| 4,613,768 | 9/1986 | Pommer, II | 327/80 |
| 5,083,045 | 1/1992 | Yim et al. | 327/80 |
| 5,118,968 | 6/1992 | Douglas et al. | 327/78 |
| 5,278,458 | 1/1994 | Holland et al. | 327/77 |
| 5,434,521 | 7/1995 | Leipold et al. | 327/78 |
| 5,512,849 | 4/1996 | Wong | 327/77 |

FOREIGN PATENT DOCUMENTS

| | | | |
|---|---|---|---|
| 0 651 506 | 5/1995 | European Pat. Off. | H03K 17/30 |
| 41 38 860 | 6/1996 | Germany | G01R 19/165 |
| 86/02492 | 4/1986 | WIPO | H01L 29/167 |

*Primary Examiner*—Toan Tran
*Attorney, Agent, or Firm*—Herbert L. Lerner; Laurence A. Greebeg

[57] ABSTRACT

A comparator circuit includes a series circuit having a first MOSFET and a second MOSFET. An inverter has a third MOSFET and a fourth MOSFET. A node between the first and second MOSFETs is connected to a gate terminal of the fourth MOSFET. An input voltage is applied between ground and the second MOSFET. A series circuit of a fifth MOSFET and a Zener diode polarized in the blocking direction is connected parallel to the fourth MOSFET. A response threshold of the comparator circuit is defined by adjusting a resistance of the Zener diode occurring in the reverse direction. The resistance is adjusted through the use of a voltage pulse that can be applied to a terminal connected to a cathode of the Zener diode.

4 Claims, 2 Drawing Sheets

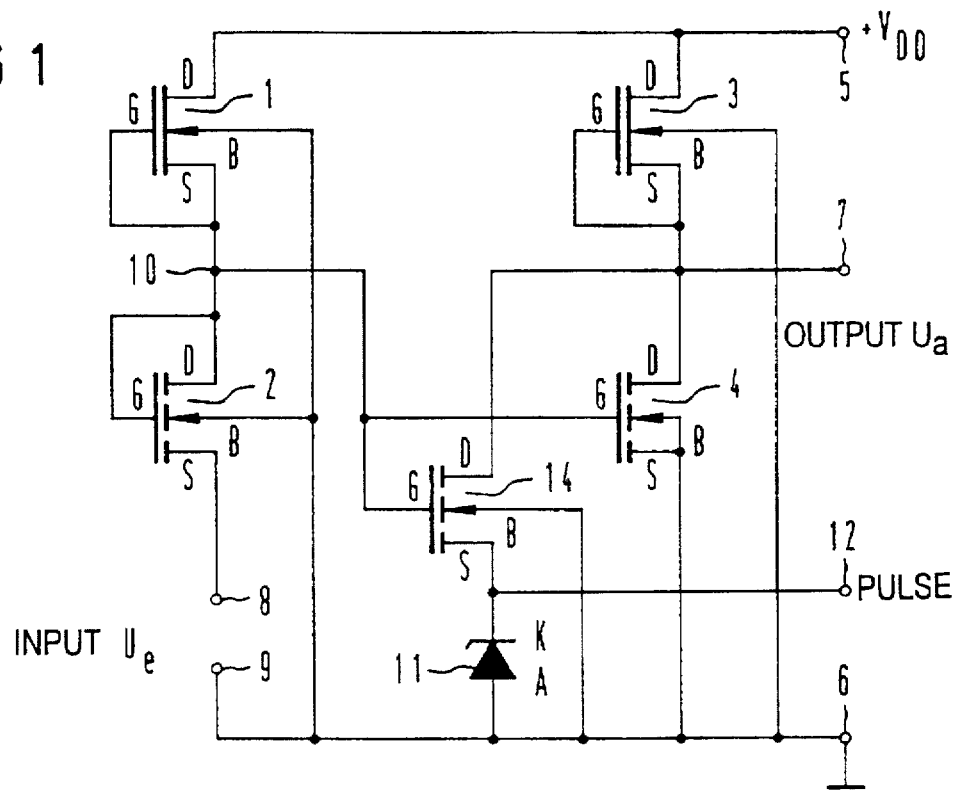
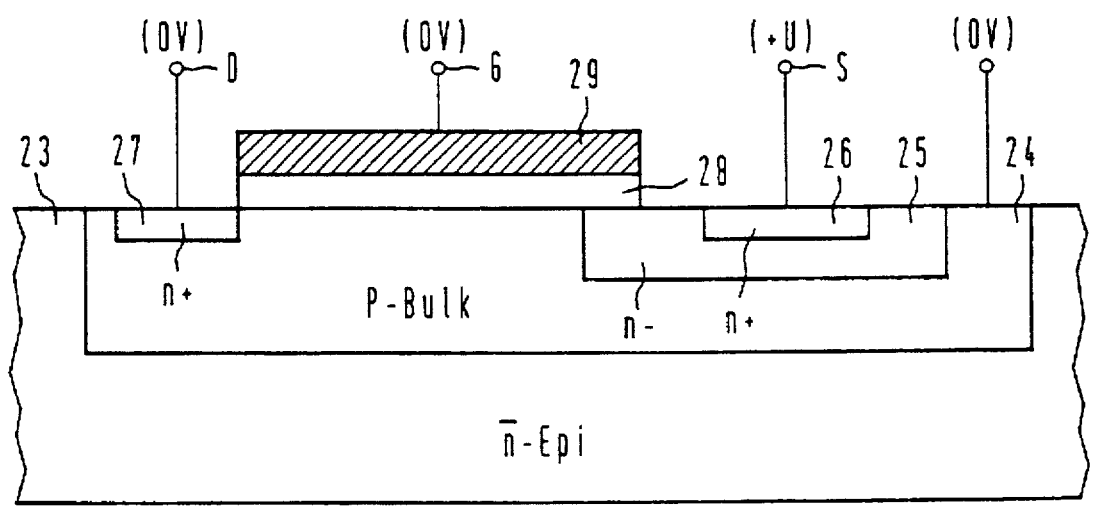

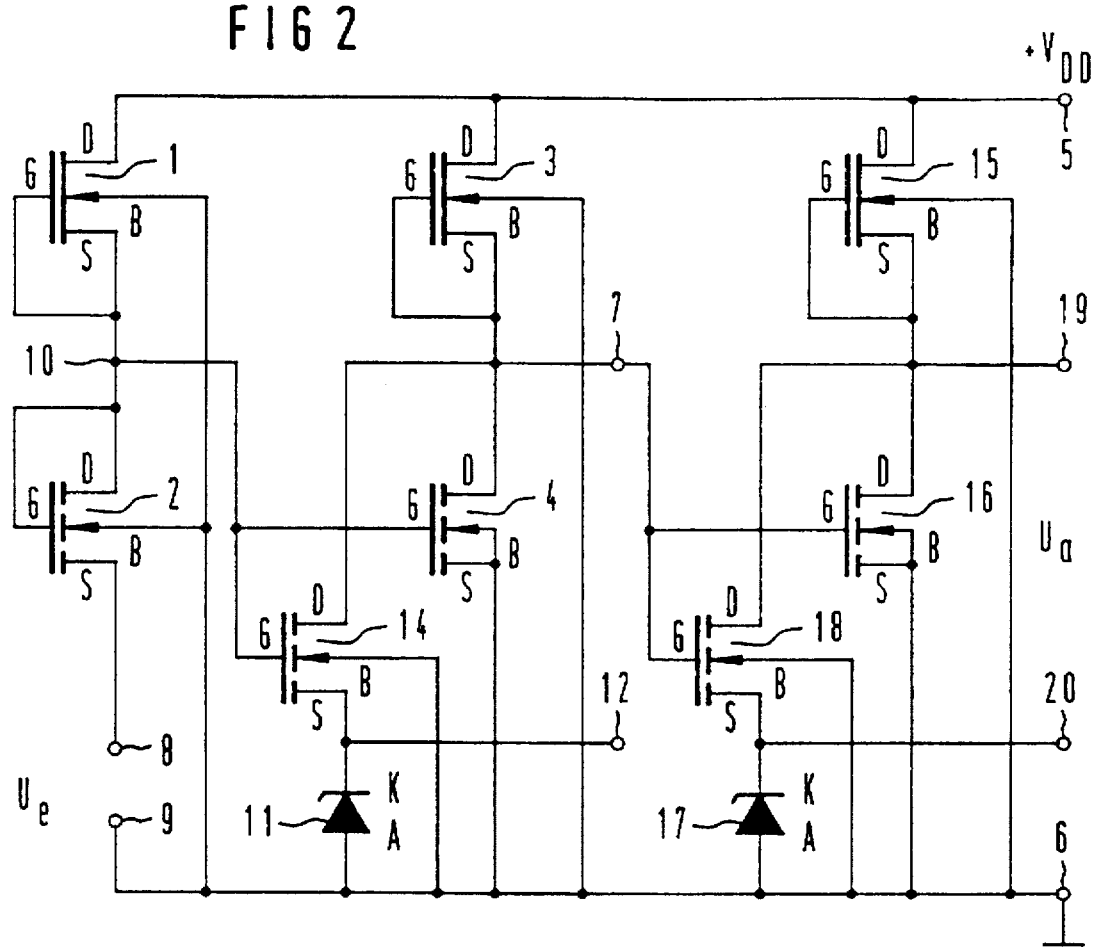

INTEGRATABLE COMPARATOR CIRCUIT WITH ADJUSTABLE RESPONSE THRESHOLD

BACKGROUND OF THE INVENTION

Field of the Invention

The invention relates to an integrated comparator circuit including a series circuit having a first and a second MOSFET, which is connected between a first terminal for an operating voltage and a first input terminal; an inverter stage having a third and a fourth MOSFET, which is connected between the first terminal and a second terminal for the operating voltage; a node between the first and second MOSFETs is connected to the gate terminal of the fourth MOSFET; a second input terminal is connected to the second terminal for the operating voltage; and a transfer characteristic curve of the second MOSFET is steeper than that of the fourth MOSFET.

Such integrated comparator circuits have been described, for instance, in German Patent DE 41 38 860 1, corresponding to U.S. Pat. No. 5,434,521, and in Published European Patent Application 0 651 506 A2, corresponding to co-pending U.S. application Ser. No. 08/330,341. They differ primarily in that in the first device only enhancement MOSFETs of both channel types are used, while in the second device depletion and enhancement MOSFETs of one and the same channel type are used.

The switching point of the comparator circuits described therein is determined by the properties of the MOSFETs. Since those properties are determined by the production process, they can vary from wafer to wafer within certain bandwidths. Therefore, the comparator threshold is also variably high.

SUMMARY OF THE INVENTION

It is accordingly an object of the invention to provide an integratable comparator circuit with an adjustable response threshold, which overcomes the hereinafore-mentioned disadvantages of the heretofore-known devices of this general type and in which an adjustment of the thresholds can be corrected retroactively in a finished component.

With the foregoing and other objects in view there is provided, in accordance with the invention, an integrated comparator circuit, comprising first and second terminals for an operating voltage; first and second input terminals, the second input terminal being connected to the second terminal for the operating voltage; a series circuit having a first MOSFET, a second MOSFET and a node connected between the first and second MOSFETs, the series circuit being connected between the first terminal for the operating voltage and the first input terminal; an inverter stage having third and fourth MOSFETs, the fourth MOSFET having a gate terminal connected to the node, the inverter stage being connected between the first and second terminals for the operating voltage; the second MOSFET having a steeper transfer characteristic curve than the fourth MOSFET; another series circuit having a Zener diode with a cathode terminal and a fifth MOSFET with a source side and a gate terminal, the Zener diode being connected to the source side and polarized in the blocking direction, the other series circuit being connected parallel to the fourth MOSFET; the gate terminals of the fourth and fifth MOSFETs being connected to one another; and a further terminal connected to the cathode terminal of the Zener diode for applying a pulse having energy for adjusting a current of the Zener diode flowing in a reverse direction.

In accordance with another feature of the invention, there is provided a further inverter stage having a sixth MOSFET and a seventh MOSFET with a gate terminal, the further inverter stage being connected parallel to the inverter stage having the third and fourth MOSFETs, the third and fourth MOSFETs having a node connected therebetween, and the seventh MOSFET having a gate terminal connected to the node between the third and fourth MOSFETs.

In accordance with a further feature of the invention, there is provided a further series circuit having an eighth MOSFET with a source side and another Zener diode with a cathode terminal, the other Zener diode being connected to the source side of the eighth MOSFET and polarized in the blocking direction, the further series circuit being connected parallel to the seventh MOSFET, and a further terminal connected to the cathode terminal of the other Zener diode for applying a pulse to adjust a current of the other Zener diode flowing in a reverse direction.

In accordance with a concomitant feature of the invention, the fifth MOSFET and the eighth MOSFET are lateral MOSFETs having a source zone embedded in a zone having the same conduction type and being more weakly doped than the source zone, and a gate electrode extending above the more weakly doped zone.

Other features which are considered as characteristic for the invention are set forth in the appended claims.

Although the invention is illustrated and described herein as embodied in an integratable comparator circuit with an adjustable response threshold, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic circuit diagram of a first exemplary embodiment of the invention;

FIG. 2 is a schematic circuit diagram of a second exemplar embodiment of the invention; and FIG. 3 is a fragmentary, diagrammatic, cross-sectional view of an exemplary embodiment of a fifth MOSFET connected in series with a Zener diode.

DESCRIPTION OF THE PREFERRED EMBODIMENTS

Referring now to the figures of the drawings in detail and first, particularly, to FIG. 1 thereof, there is seen an integrated comparator circuit which includes a series circuit having a first MOSFET 1 and a second MOSFET 2. The MOSFET 1 is connected on the drain side to a first terminal 5 for a supply voltage. A source terminal of the MOSFET 2 is connected to a first input terminal 8. A second input terminal 9 is connected to fixed potential, such as ground, through a second terminal 6 for the supply voltage. An inverter having a third MOSFET 3 and a fourth MOSFET 4 is connected to the terminals 5, 6. The MOSFET 3 is connected on the drain side to the terminal 5 and the MOSFET 4 is connected on the source side to the terminal 6. A node between the MOSFETs 3 and 4 is connected to an output terminal 7.

A series circuit having a fifth MOSFET 14 and a Zener diode 11 is connected parallel to the MOSFET 4. Drain terminals of the two MOSFETs 4, 14 are connected to one another, while a source terminal of the MOSFET 14 is connected to a cathode terminal of the Zener diode 11. The source terminal of the MOSFET 14 and the cathode terminal of the Zener diode 11 are connected to a freely accessible terminal 12, the purpose of which will be explained below.

Gate terminals of the MOSFETs 1 and 3 are each connected to their respective source terminal and a gate terminal of the MOSFET 2 is connected to its drain terminal. However, the gate terminals could also be connected to fixed potentials. The MOSFETs also have bulk terminals B, which are connected to ground in the case of the MOSFETs 1–3 and to the source terminal in the case of the MOSFET 4. The connection of the bulk terminals to ground for the MOSFETs 1–3 is necessary whenever they are made by a so-called self-insulating technique. If they are made by some other technology, such as with dielectric insulation, then the bulk terminal of each MOSFET may be connected to its source terminal.

In order to explain the mode of operation, it will first be assumed that an input voltage $U_e$ at the terminals 8, 9 is below a response threshold of the comparator. A current then flows from the terminal 5 to the terminal 6 through the MOSFETs 1 and 2 and through the control stage that furnishes the input voltage. A voltage is thus established at a node 10 between the MOSFETs 1 and 2 that keeps the MOSFET 4 blocked. The MOSFET 3 has a lower drain-to-source resistance, since its operating point is in the steep portion of the $I_D/U_{DS}$ characteristic curve. A high voltage, which is approximately equivalent to the voltage $V_{DD}$, therefore appears at the output 7.

If a higher voltage is applied to the input terminals 8, 9, then the voltage at the node 10 rises in accordance with a voltage divider ratio between the MOSFETs 1 and 2. If the voltage at the node 10 exceeds an inception voltage of the MOSFET 4, then this MOSFET is made conducting, and the voltage at the output 7 drops. The current is limited by the MOSFET 3, which in the present case is connected as a diode. In the event that its bulk terminal B is connected to the source terminal S, it acts as a current source. In both cases, a current that is determined by the intersection of its $I_D/U_{DS}$ characteristic curves flows through the inverter. A voltage $U_a$ between the terminals 7 and 6 is supplied, for instance, to a Schmitt trigger, having output signal levels which are chosen in such a way that they correspond to either logical "0" or logical "1".

In order to establish a defined response threshold of the comparator circuit, the transfer characteristic curve $I_D/U_{GS}$ of the MOSFET 4 is established to be flatter than that of the transistor 2. This can be accomplished, for instance, through the use of a different ratio between the channel length and the channel width. The transfer characteristic curves of the MOSFETs 1 and 3 may, but need not, be the same. Since the transfer characteristic curves, like other parameters, can vary from one component to another because of production variations, the transfer characteristic curve of the MOSFET 4 is externally adjusted to the desired value after the comparator has been completed. This is carried out by applying a current pulse to the terminal 12 that generates a voltage at the Zener diode which is greater than the Zener voltage. The Zener diode 11 is constructed in such a way that an alloy channel is created between the cathode terminal and the anode terminal through the use of the current pulse, which channel forms a defined ohmic resistance. The magnitude of the resistance can be determined by the energy of the pulse.

Such a Zener diode for setting a defined resistance is known per se and has been described, for instance, in Published International Patent Application WO 86/02492.

The MOSFET 14 is then connected parallel to the MOSFET 4 through a defined resistance formed by the Zener diode 11. Since both gate terminals are connected to one another, a higher current then flows, as referred to the same voltage at the node 10. The transfer characteristic curve $I_D/U_{GS}$ of the described parallel circuit is then steeper than that of the MOSFET 4 by itself. This means that the response threshold of the comparator is shifted to lower values of the input voltage $U_e$.

FIG. 2 shows a comparator circuit that is expanded over the comparator circuit of FIG. 1. The expanded comparator circuit is distinguished over the circuit of FIG. 1 in that it has a further inverter with sixth and seventh MOSFETs 15 and 16. A drain terminal of the MOSFET 15 is connected to the first supply voltage terminal 5 and a source terminal of the MOSFET 16 is connected to the second supply voltage terminal 6. A node between a source terminal of the MOSFET 15 and a drain terminal of the MOSFET 16 is connected to an output terminal 19. Analogously to the circuit of FIG. 1, a series circuit including an eighth MOSFET 18 and another Zener diode 17 polarized in the blocking direction is connected parallel to the MOSFET 16. A source terminal of the MOSFET 18 and a cathode terminal K of the Zener diode 17 are connected to a freely accessible terminal 20. Gate terminals of the MOSFETs 16, 18 are electrically connected to the output 7.

In order to explain the mode of operation, it is again assumed that the input voltage $U_e$ is initially below the response threshold of the comparator. Then the output 7, as described in conjunction with FIG. 1, is at a potential that is approximately equivalent to the operating voltage $V_{DD}$. This makes the MOSFET 16 conductive, and the output voltage $U_a$ at the output 19 is low (level L). If the input voltage $U_e$ rises, then the potential at the node 10 rises, until the inception voltage of the MOSFET 4 is reached. Thus the voltage at the output 7 drops, and the MOSFET 16 is blocked once its inception voltage is undershot. The output voltage $U_a$ at the output 19 thus rises to a value that is approximately equivalent to the supply voltage $V_{DD}$ (level H).

The diode 17 can be converted to a defined resistance through the use of a defined supply of energy through the terminal 20, as already described in conjunction with FIG. 1 for the diode 11. Thus the MOSFET 18 is connected parallel, through a defined resistance, to the MOSFET 16. This means that at a correspondingly low voltage at the output 7, the voltage at the output 19 then drops to the level L. This lower voltage at the output 7 corresponds to a higher voltage value at the node 10 and at the input 8, 9. In other words, by connecting the MOSFETs 16, 18 parallel, the response threshold of the comparator is raised.

If the response threshold of the circuit of FIG. 2 is too high, then as described in conjunction with FIG. 1, it is reduced by connecting the MOSFETs 14 and 4 parallel. The Zener diode 17 remains blocked and the MOSFET 18 is not connected parallel to the MOSFET 14.

Since the cathode terminal of the Zener diode 11, 17 is loaded by a positive pulse, the p-n junction is biased in the blocking direction between the source zone of the respective MOSFET 14 and 18 and its bulk zone. Since both zones are normally highly doped, this p-n junction could be destroyed. It is therefore necessary to embed the source zone of the MOSFETs 14, 18 in a lower-doped zone, which extends beneath the gate electrode. FIG. 3 shows that a p-conducting bulk zone 24 is embedded in a weakly n-doped epi-substrate. A weakly n-doped zone 25 is embedded in the bulk zone 24, and a strongly n-doped source zone 26 is embedded in the zone 25. A strongly n-doped drain zone 27 is also embedded in the bulk zone. A gate electrode 29 is disposed on a gate oxide layer 28 which is located over the semiconductor body. The gate oxide and the gate electrode extend from the drain zone 27 to the weakly n-doped zone 25. Given a more-positive gate voltage, a conductive channel can then form between the weakly n-doped zone 25 and the drain zone 27. The zone 25 may be overlapped by the gate electrode 29.

We claim:

1. An integrated comparator circuit, comprising:

a) first and second terminals for receiving an operating voltage;

b) first and second input terminals for receiving an input signal, said second input terminal being connected to said second terminal for the operating voltage;

c) a series circuit having a first MOSFET, a second MOSFET and a node connected between said first and second MOSFETs, said series circuit being connected between said first terminal for the operating voltage and said first input terminal;

d) an inverter stage having third and fourth MOSFETs, said fourth MOSFET having a gate terminal connected to said node and a drain coupled to an output of the comparator circuit, said inverter stage being connected between said first and second terminals for the operating voltage;

e) said second MOSFET having a steeper transfer characteristic curve than said fourth MOSFET;

f) another series circuit having a Zener diode with a cathode terminal and a fifth MOSFET with a source side and a gate terminal, said Zener diode being connected to said source side and polarized in the blocking direction, said other series circuit being connected parallel to said fourth MOSFET;

g) the gate terminals of said fourth and fifth MOSFETs being connected to one another; and h) a further terminal connected to the cathode terminal of said Zener diode for receiving a pulse having energy for adjusting a current of said Zener diode flowing in a reverse direction.

2. The integrated comparator circuit according to claim 1, including a further inverter stage having a sixth MOSFET and a seventh MOSFET with a gate terminal, said further inverter stage being connected parallel to said inverter stage having said third and fourth MOSFETs, said third and fourth MOSFETs having a node connected therebetween, and said seventh MOSFET having a gate terminal connected to said node between said third and fourth MOSFETs.

3. The integrated comparator circuit according to claim 2, including a further series circuit having an eighth MOSFET with a source side and another Zener diode with a cathode terminal, said other Zener diode being connected to the source side of said eighth MOSFET and polarized in the blocking direction, said further series circuit being connected parallel to said seventh MOSFET, and a further terminal connected to the cathode terminal of said other Zener diode for applying a pulse to adjust a current of said other Zener diode flowing in a reverse direction.

4. The integrated comparator circuit according to claim 3, wherein said fifth MOSFET and said eighth MOSFET are lateral MOSFETs having a source zone embedded in a zone having the same conduction type and being more weakly doped than said source zone, and a gate electrode extending above said more weakly doped zone.

* * * * *